United States Patent
Shu et al.

(10) Patent No.: US 9,484,076 B1
(45) Date of Patent: *Nov. 1, 2016

(54) SYSTEMS AND METHODS OF DOUBLE/QUAD DATA RATE MEMORY INVOLVING INPUT LATCHING, SELF-TIMING AND/OR OTHER FEATURES

(71) Applicant: GSI TECHNOLOGY, INC., Sunnyvale, CA (US)

(72) Inventors: Leelean Shu, Los Altos, CA (US); Yoshi Sato, San Jose, CA (US); Hsin You S. Lee, Campbell, CA (US)

(73) Assignee: GSI TECHNOLOGY, INC., Sunnyvale, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 14/881,098

(22) Filed: Oct. 12, 2015

Related U.S. Application Data

(63) Continuation of application No. 14/105,124, filed on Dec. 12, 2013, now Pat. No. 9,159,391.

(60) Provisional application No. 61/737,059, filed on Dec. 13, 2012.

(51) Int. Cl.
*G11C 7/22* (2006.01)
*G11C 8/04* (2006.01)
*G11C 7/10* (2006.01)

(52) U.S. Cl.
CPC ............... *G11C 8/04* (2013.01); *G11C 7/1072* (2013.01); *G11C 7/222* (2013.01); *G11C 7/1087* (2013.01)

(58) Field of Classification Search
CPC ...... G11C 7/1072; G11C 7/1087; G11C 8/04

USPC .......... 365/189.05, 189.04, 189.14, 189.15, 365/189.16, 230.08, 233.1, 233.13
See application file for complete search history.

(56) References Cited

U.S. PATENT DOCUMENTS

| | | | |
|---|---|---|---|
| 5,295,115 A | 3/1994 | Furuya et al. | |
| 5,327,390 A | 7/1994 | Takasugi | |
| 5,493,530 A | 2/1996 | Lee et al. | |
| 5,841,732 A | 11/1998 | Mick | |
| 5,864,252 A | 1/1999 | Tran et al. | |
| 5,898,331 A | 4/1999 | Fujita | |
| 7,113,446 B2 | 9/2006 | Fujisawa | |
| 7,142,477 B1 | 11/2006 | Tran et al. | |
| 8,737,160 B2 | 5/2014 | Hayashi | |
| 9,159,391 B1 * | 10/2015 | Shu ......................... | G11C 8/04 |
| 2003/0065900 A1 | 4/2003 | Mes | |
| 2005/0141333 A1 | 6/2005 | Fujisawa | |
| 2008/0144376 A1 * | 6/2008 | Lee ........................ | G11C 16/10 365/185.05 |
| 2009/0016120 A1 * | 1/2009 | Kinoshita et al. ... | G11C 7/1072 365/189.05 |

OTHER PUBLICATIONS

File History of U.S. Appl. No. 14/105,133.

* cited by examiner

*Primary Examiner* — Tan T Nguyen
(74) *Attorney, Agent, or Firm* — DLA Piper LLP (US)

(57) ABSTRACT

Systems and methods relating to memory and/or memory latching are disclosed. In one exemplary implementation, an illustrative memory device may include self-timed pulse generator circuitry, first input latch circuitry, read/write control circuitry, and second input latch circuitry. According to further implementations herein, fast address access for read and write may be provided in the same cycle via a self-timed pulse in the input latch circuit and/or via associated control/scheme from the control circuit.

50 Claims, 9 Drawing Sheets

Block Diagram of Self-timed Input Latch Synchronous Memory with Read and Write in the Same Cycle

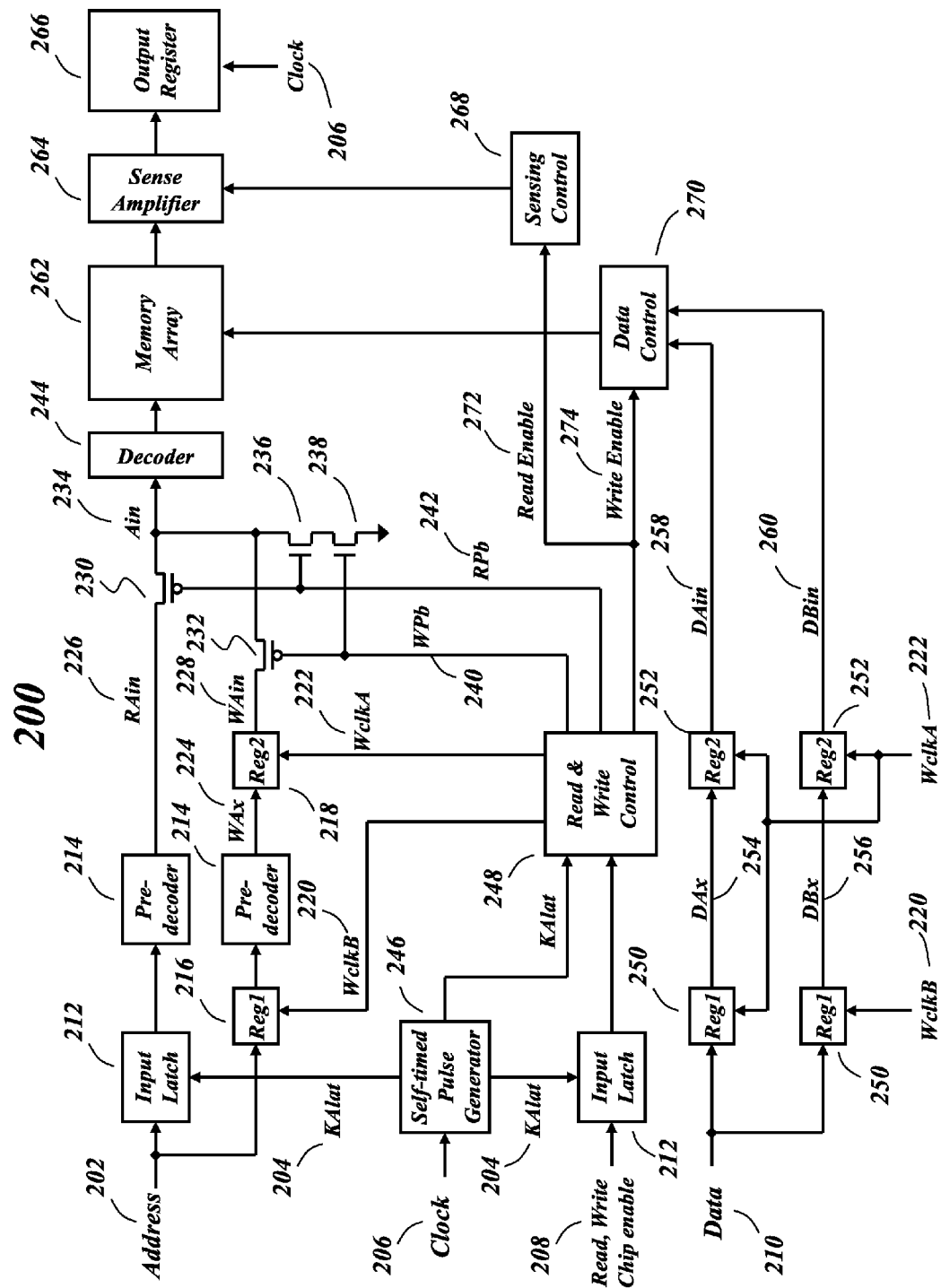
Figure 2: Block Diagram of Self-timed Input Latch Synchronous Memory with Read and Write in the Same Cycle

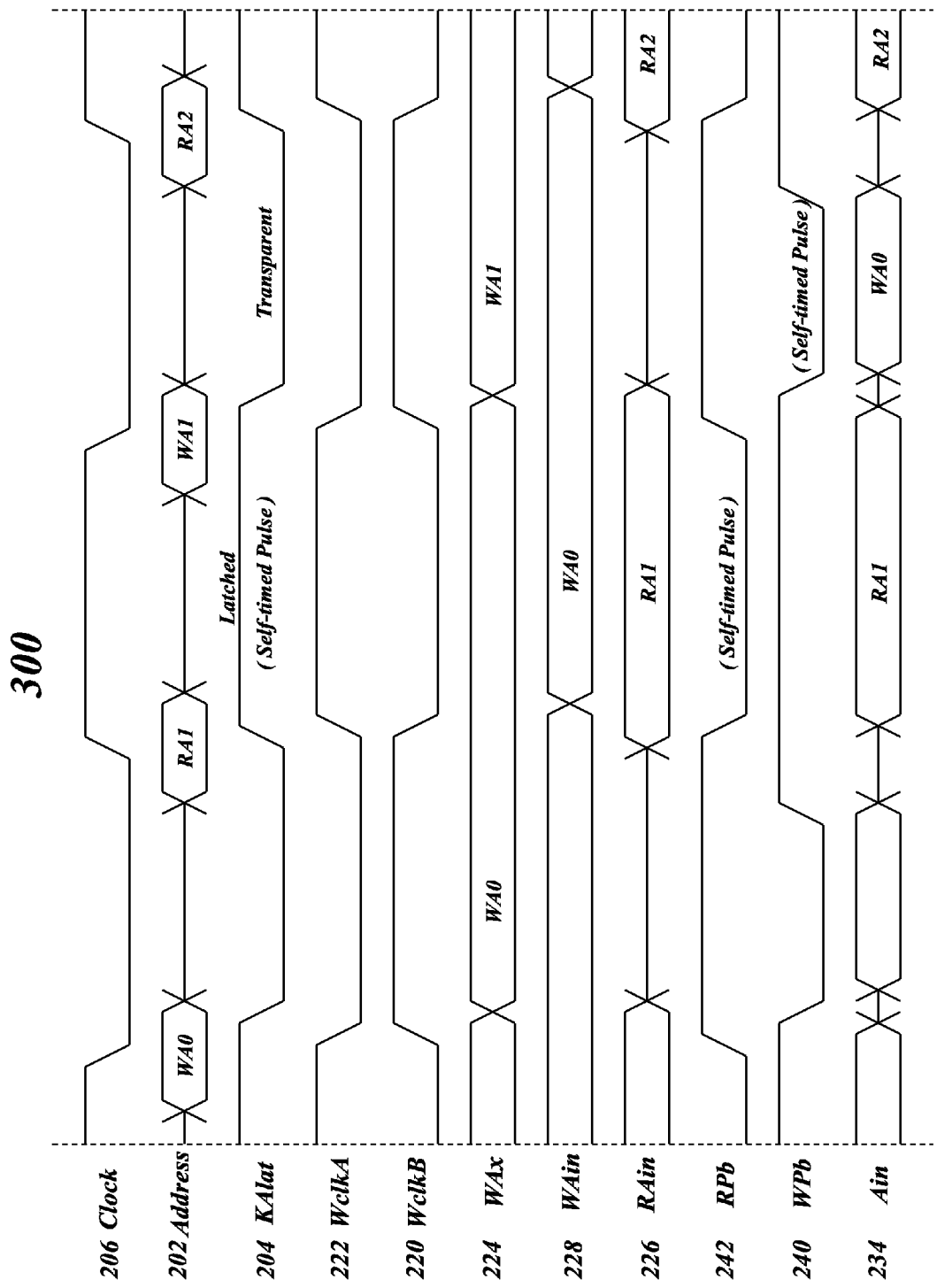
Figure 3: Timing Diagram of Self-timed Input Latch with Read and Write in the Same Cycle

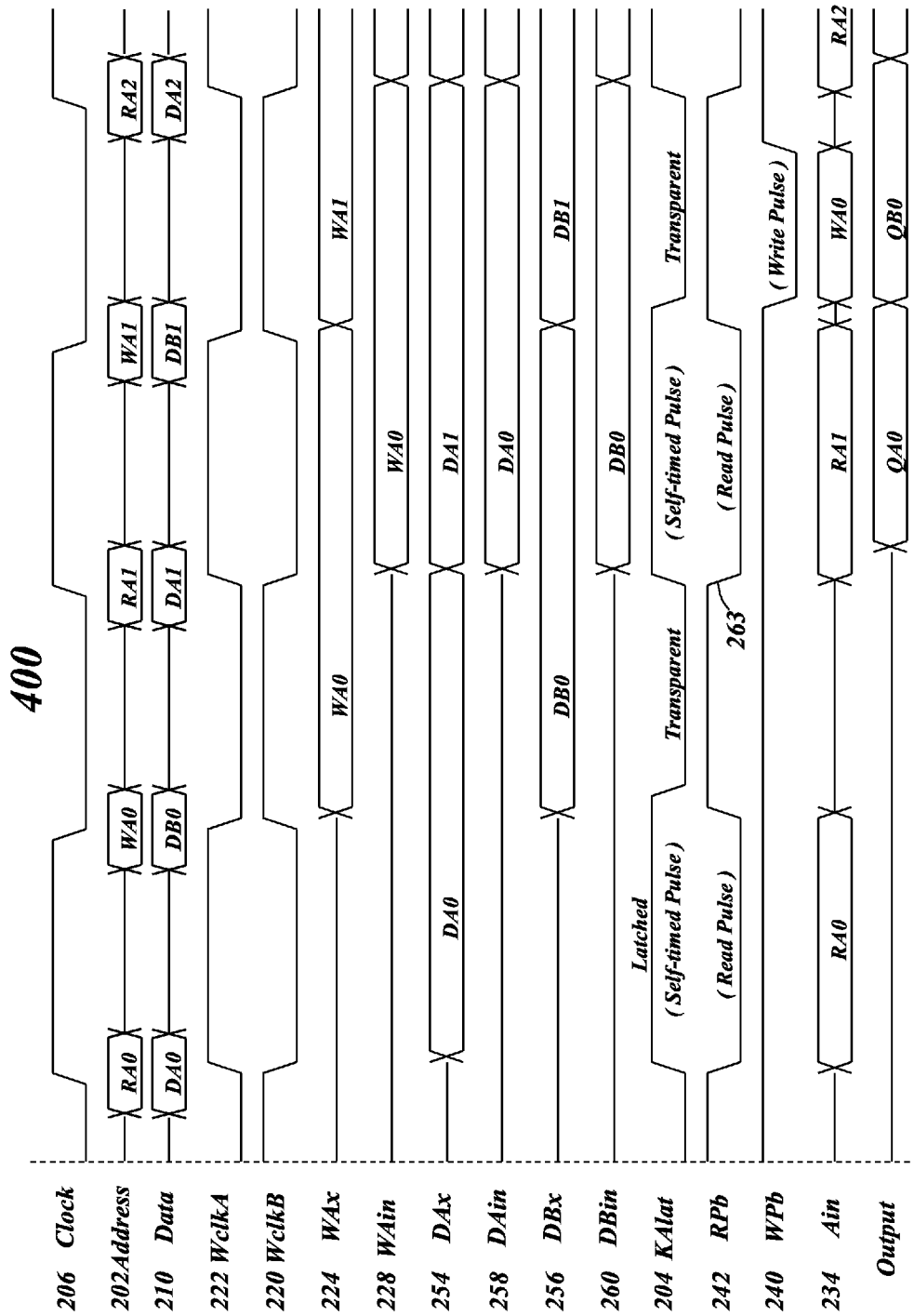
Figure 4: Timing Diagram of Self-timed Input Latch with Read and Write in the Same Cycle

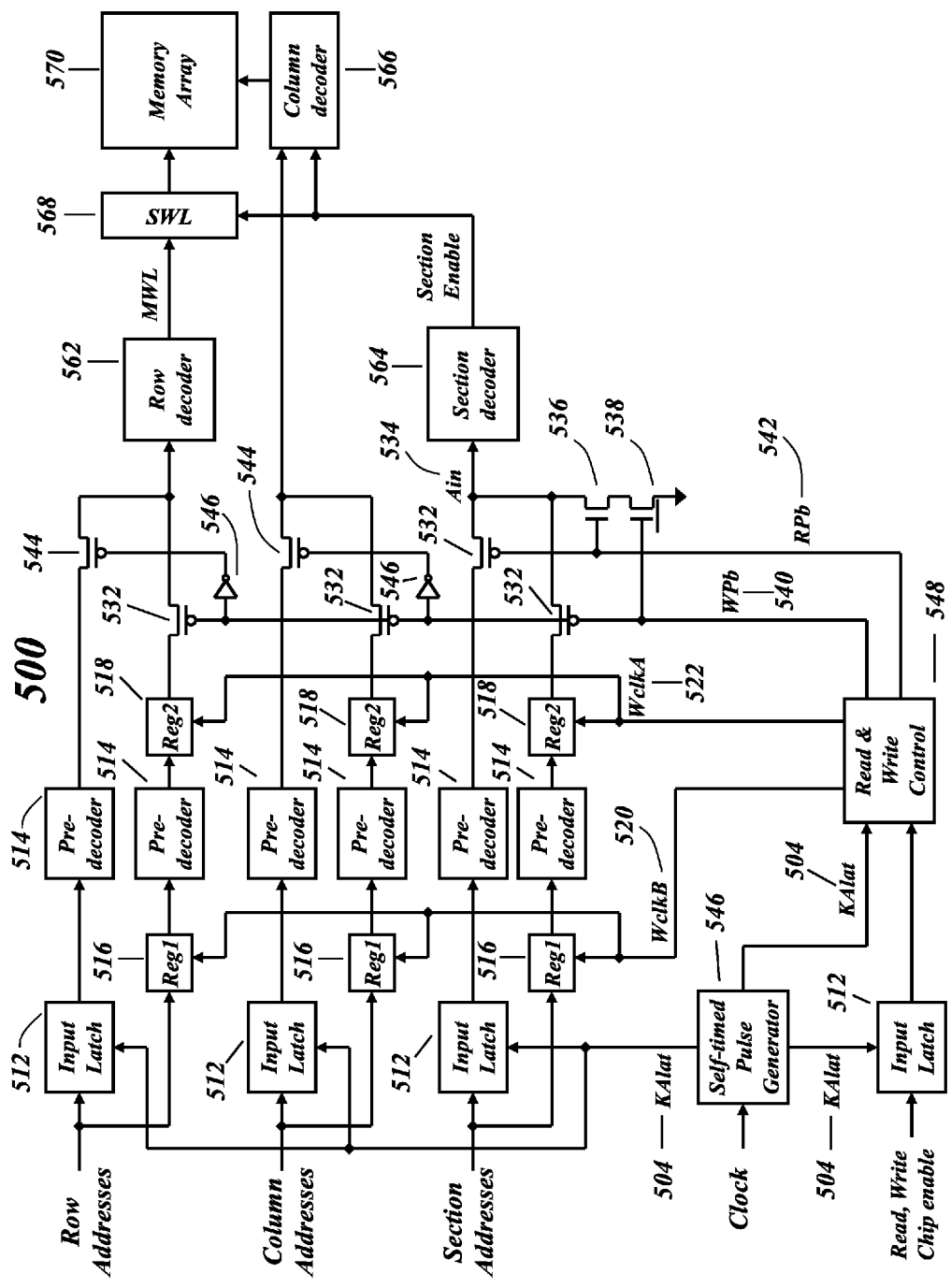
Figure 5: Block Diagram of Self-timed Input Latch Synchronous Memory with Read and Write in the Same Cycle

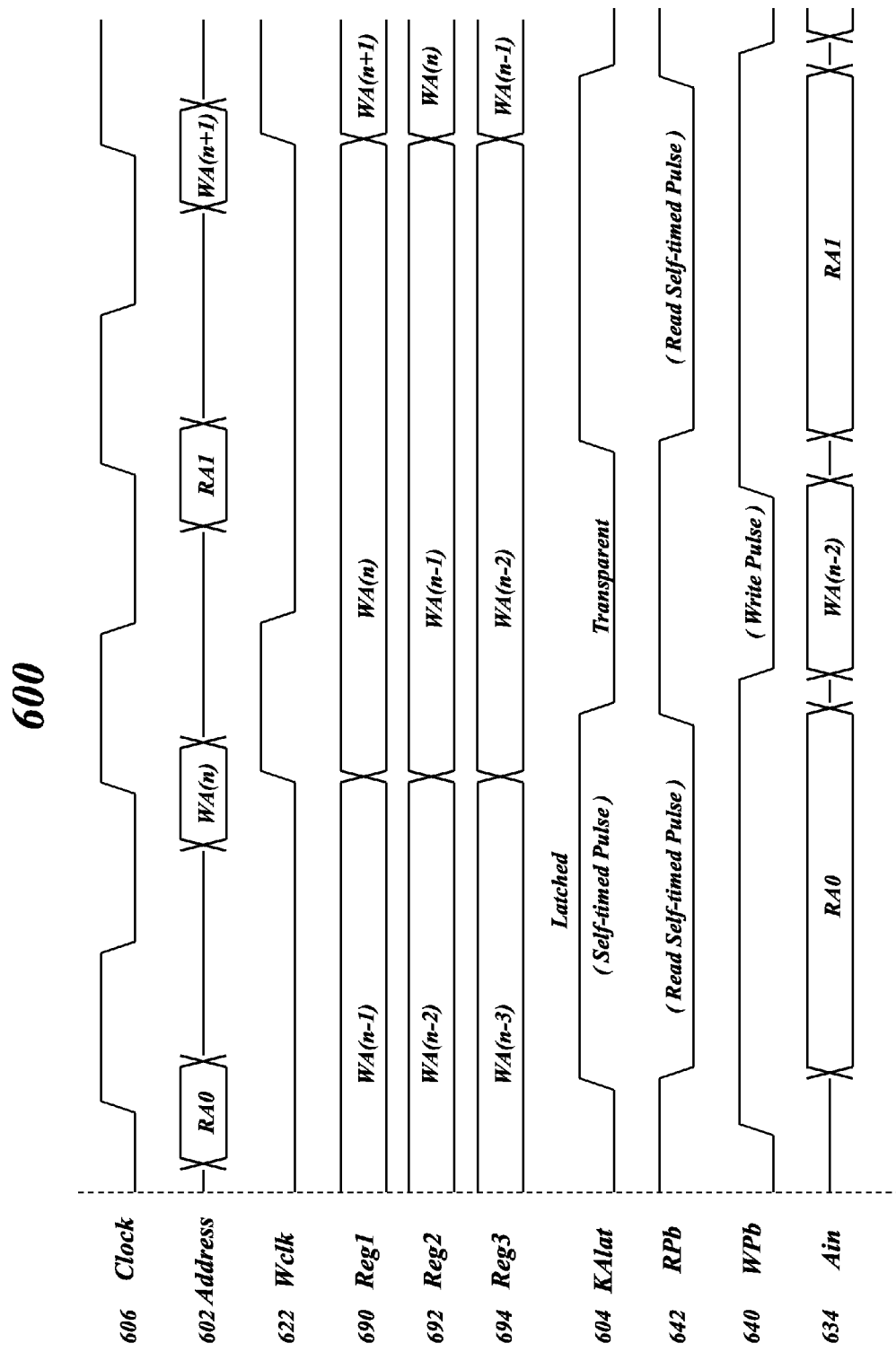
*Figure 6: Timing Diagram of Self-timed Input Latch with Read and Write Cycle*

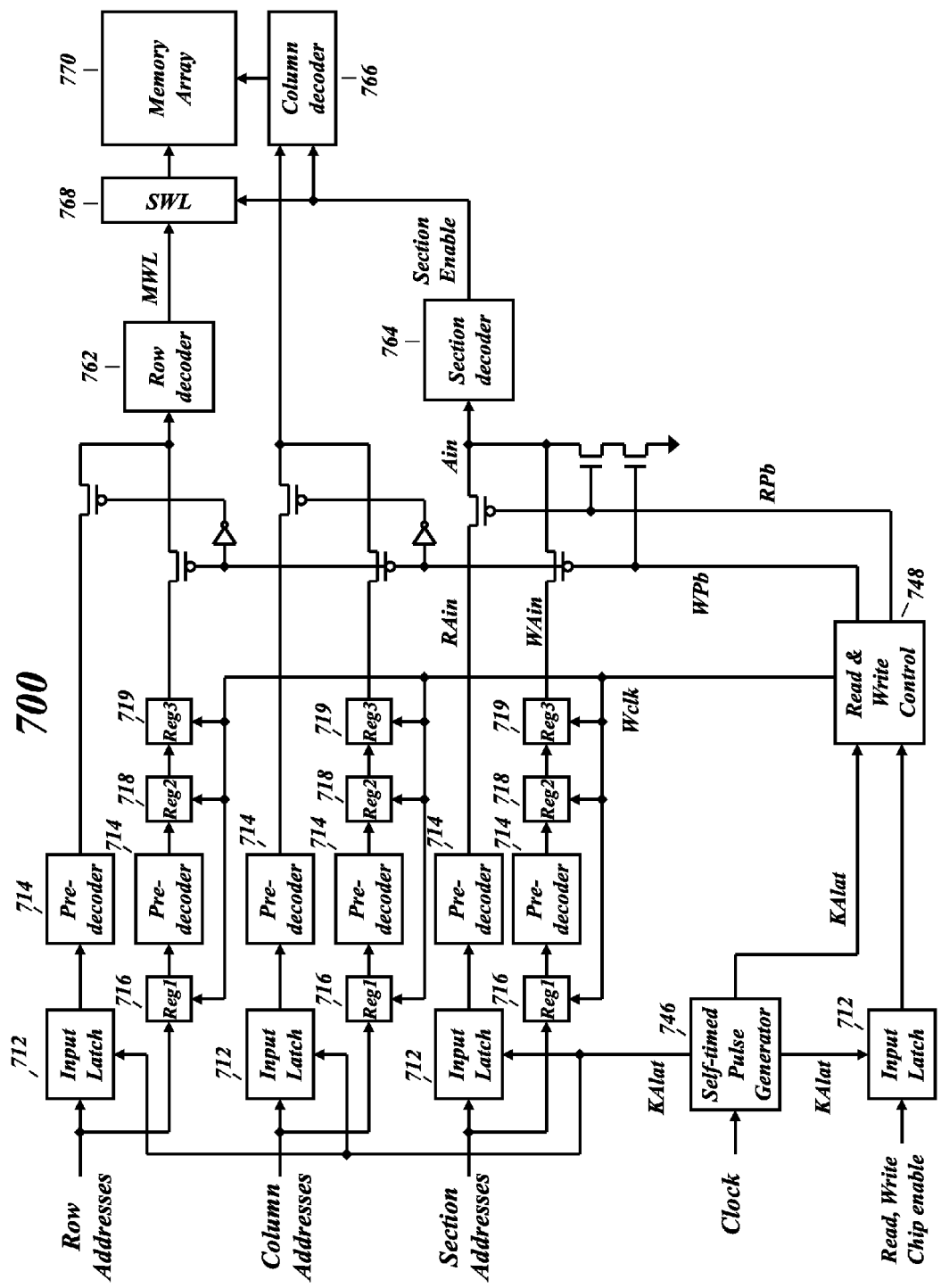
Figure 7: Block Diagram of Self-timed Input Latch Synchronous Memory

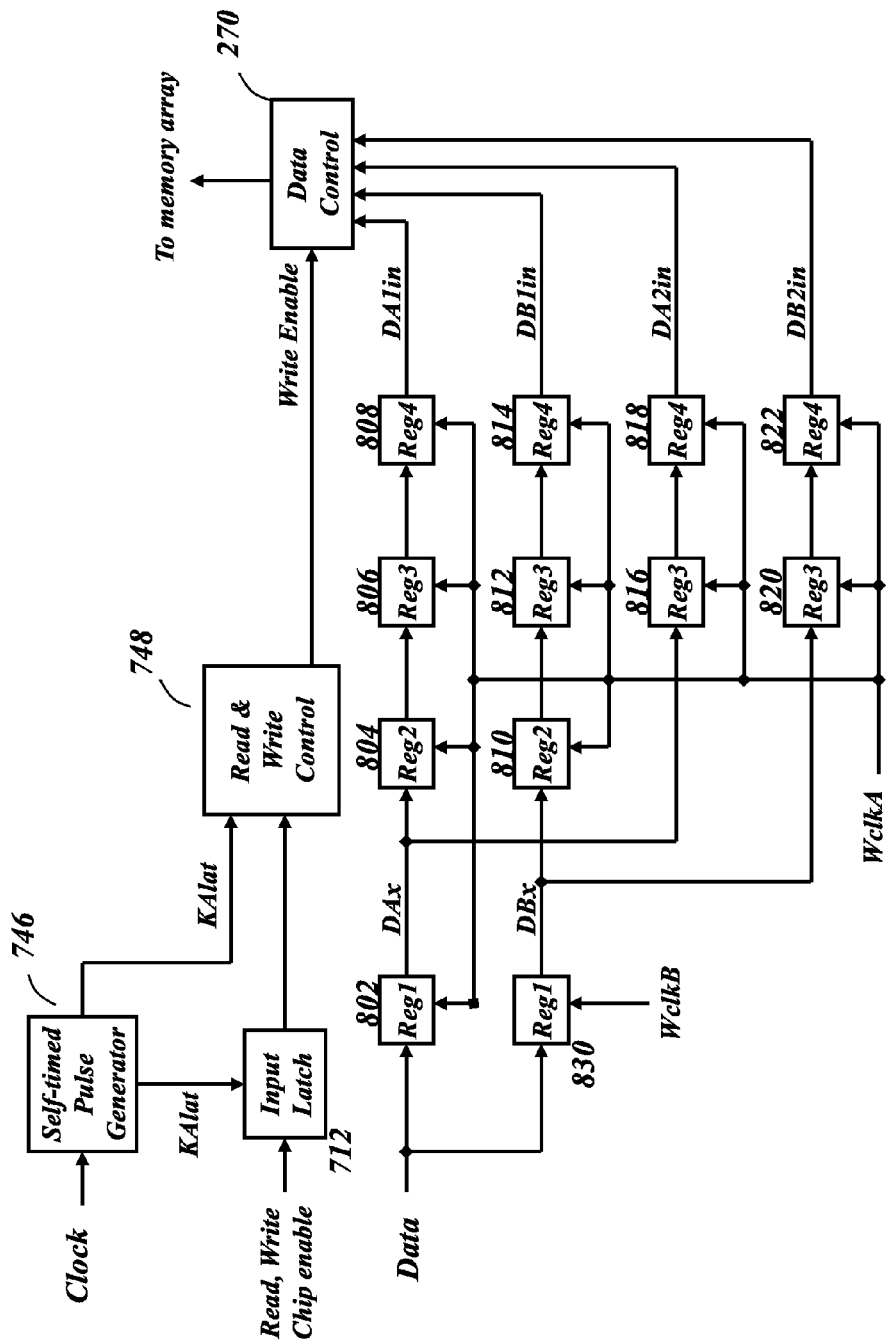
Figure 8: burst-four data path pertinent to figure 7

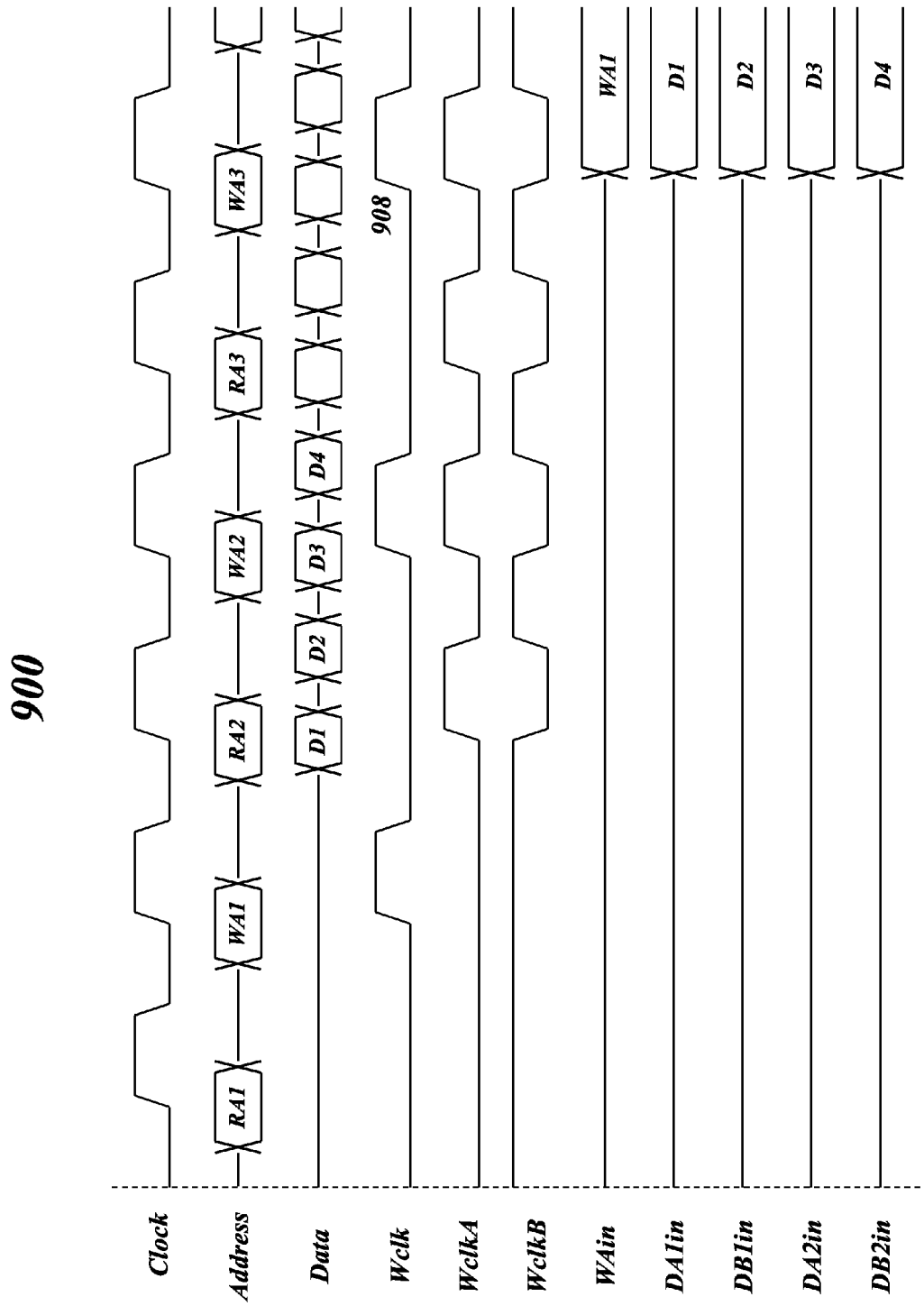
Figure 9: Timing Diagram of Burst-four Read, Write addresses and Write Data

SYSTEMS AND METHODS OF DOUBLE/QUAD DATA RATE MEMORY INVOLVING INPUT LATCHING, SELF-TIMING AND/OR OTHER FEATURES

CROSS-REFERENCE TO RELATED APPLICATION

This is a continuation of application Ser. No. 14/105,124, filed Dec. 12, 2013, now U.S. Pat. No. 9,159,391, which claims the benefit/priority of provisional application No. 61/737,059, filed Dec. 13, 2012, which are incorporated herein by reference in entirety.

BACKGROUND

1. Field

Aspect of the innovations herein relate generally to memory and/or memory latching and, more specifically, to systems and methods of memory and memory operation, such as fast address access for read and write in the same cycle.

2. Description of Related Information

Figure 1A:
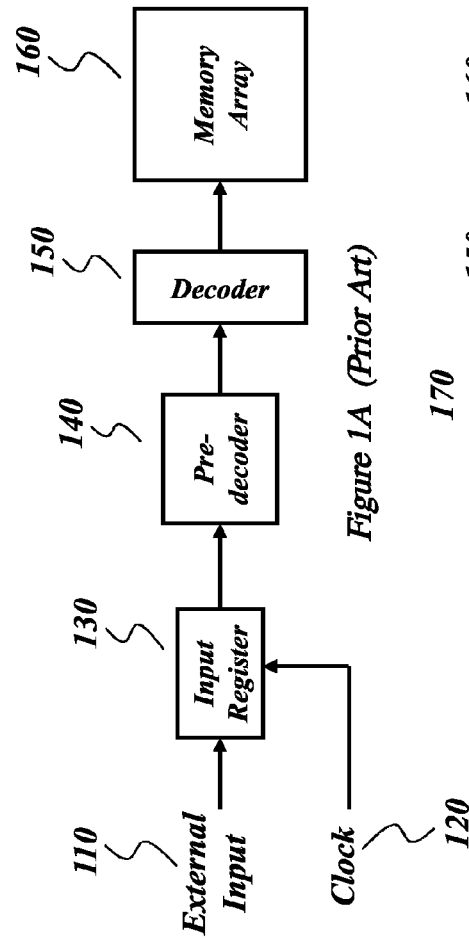
Figure 1B:
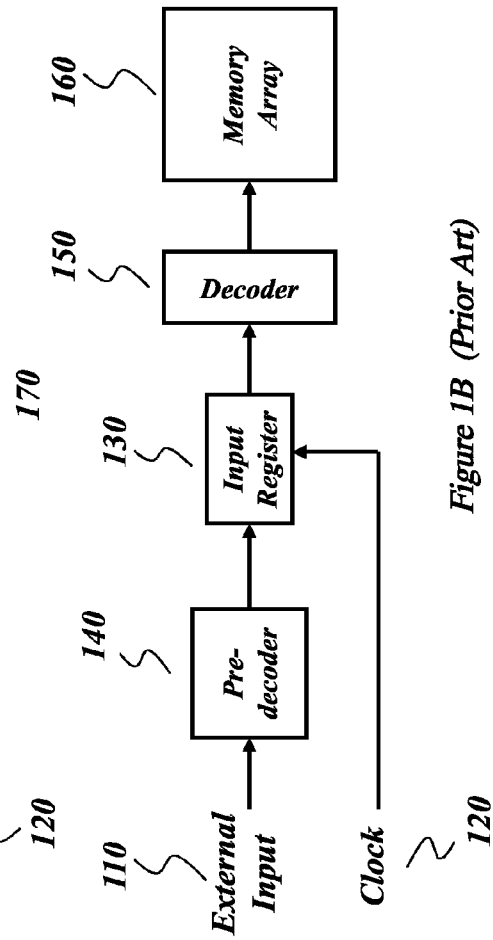

In many memory circuits, inputs are registered by a clock in the SRAM. Thus for proper operation, all read or write operations should occur after the rising edge of a clock. For synchronous operation, then, there must be a setup time and hold time to ensure that an input is properly registered. FIG. 1A is a block diagram of an existing memory circuit 100. External input 110 and clock 120 signals are fed into an input register 130. Here, the usage of setup time is only pertinent to the input register. The output of the input register 130 can be fed into a pre-decoder 140 which in turn supplies a signal to a decoder 150, which in turn supplies a signal to a memory array 160. FIG. 1B is a block diagram of another prior art memory circuit 100. In this embodiment, an external input 110 is first supplied to a pre-decoder 140. The output of the pre-decoder 140 and a clock 120 are supplied to an input register 130 which in turn supplies a signal to a decoder 150, which in turn supplies a signal to a memory array 160. In both cases, an input register 130 is used to ensure synchronous memory circuit operation.

However, there is a need for systems and methods that provide for fast address access for read and write in the same cycle and/or other advantages over such existing circuitry.

BRIEF DESCRIPTION OF TUE DRAWINGS

The accompanying drawings, which constitute a part of this specification, illustrate various implementations and features of the present inventions and, together with the description, help explain aspects of the innovations herein. In the drawings:

FIG. 1A is a block diagram of a known memory circuit.
FIG. 1B is a block diagram of a known memory circuit.
FIG. 2 is a block diagram of an illustrative memory circuit consistent with certain aspects related to the innovations herein.
FIG. 3 is a timing diagram for an illustrative memory circuit consistent with certain aspects related to the innovations herein.
FIG. 4 is an illustrative burst-two timing diagram for a memory circuit consistent with certain aspects related to the innovations herein.
FIG. 5 is a block diagram of another memory circuit consistent with certain aspects related to the innovations herein.

FIG. 6 is an illustrative timing diagram involving self-autonomous read/write aspects of a burst-four memory circuit consistent with certain aspects related to the innovations herein.
FIG. 7 is a block diagram of an illustrative burst-four memory circuit consistent with FIG. 6 and certain aspects related to the innovations herein.
FIG. 8 is a block diagram of an illustrative data path as may be associated with implementations of FIG. 7, consistent with certain aspects related to the innovations herein.
FIG. 9 is a timing diagram of illustrative burst-four read, write address and write data features, consistent with certain aspects related to the innovations herein.

DETAILED DESCRIPTION OF ILLUSTRATIVE IMPLEMENTATIONS

Reference will now be made in detail to the inventions herein, examples of which are illustrated in the accompanying drawings. The implementations set forth in the following description do not represent all implementations consistent with the claimed inventions. Instead, they are merely some examples consistent with certain aspects related to the present innovations. Wherever possible, the same reference numbers will be used throughout the drawings to refer to the same or like parts.

Aspects of the innovations herein relate generally to memory and/or memory latching, such as systems and methods of fast address access for read and write in the same cycle via self-timed pulse input latch circuitry/scheme(s).

FIG. 2 is a block diagram of a memory circuit according to certain implementations of the innovations herein. Referring to FIG. 2, elements for generating a self-timed input latch may include input latches 212, pre-decoders 214, a self-timed pulse generator 246, a read and write control 248, transistors or other switches 230, 232, 236, 238, and/or registers 218, 250, 252. A self-timed input latch generated by such elements may be utilized beyond the specific example shown. In this example, it is used for memory operations by a decoder 244, memory array 262, sense amplifier 264, and output register 266 herein, although such self-timed input latch may be used with other memory configurations or circuitry. While data control 270, sensing control 268, and Reg1/Reg2 elements are represented, such elements are not part of the latching block(s) but are shown to provide an overall picture of memory system with the self-timed input latch. Signals shown in later timing diagram herein are not particularly related to any such elements except the data inputs. Such data inputs appear in FIG. 4 along with the write address, for example, to show how write operation information is collected in the burst-two mode to enable self-autonomous read/write control configurations. Further, according to some systems and methods herein, the write address and data need to be ready at the next rising clock edge in order to implement self-autonomous read/write control aspects consistent with innovations herein.

In accord with the implementations of FIG. 2 and elsewhere, the present systems and methods may utilize the input setup time to substantially eliminate delays and complete some front-end tasks. Some implementations may, for example, eliminate delays from input buffers, transmit a signal through a distance inside of a chip, and/or perform pre-decoding. To provide fast address access, the input latch may be in the transparent state before a next clock rising edge. Fast address access for read and write operations in the same cycle may also be enabled by utilizing a self-timed pulse input latch scheme.

FIGS. 3-4 are timing diagrams for a memory circuit according to implementations of the present innovations. At the beginning of a cycle, the clock rising edge may create a positive self-timed pulse KAlat 204 through the self-time pulse generator. The polarity of the input latch self-time pulse can be positive or negative. In the examples of FIGS. 3-4 a positive pulse is shown. At the rising edge of KAlat 204, the input latch may be changed to the latched state. Thus, the internal signal RAM 226, for the read address, may be unaffected by external signals and may remained unchanged during the KAlat 204 self-timed pulse, as shown in FIG. 3. A read and write operation may be performed in the same cycle, and in this example a read operation is followed by a write operation. The read address may be synchronized to the rising edge of clock, whereas the write address may be synchronized to the falling edge of clock. In the example of FIG. 2, the read self-timed pulse (RPb) 242 is derived from KAlat 204, the input latch signal, and a read control signal first and then the write self-timed pulse (WPb) 240 is triggered by the completion of the read pulse if a valid write is in effect. There may be a small time gap between read pulse (RPb) 242 and the write pulse (WPb) 240, which may prevent any overlapping of read and write address. An example of address transition timing of read and write in the same cycle is shown in FIGS. 3-4. The KAlat 204 self-timed pulse width may be determined to ensure the completion of read operations. Emulation of array timing and/or feedbacks from the array may be used to determine the self-timed pulse width, for example. At the end of the KAlat 204 pulse, all input latches may be changed from a latched state to a transparent state to allow for acceptance of the next cycle input information.

Further, the internal read pulse 242 and write pulse 240 may be independent of cycle time as well as clock edges. In some implementations, self-autonomous read/write control configurations, e.g., where a write self-timed pulse is triggered by the completion of a read self-timed pulse, may be utilized. This triggering may provide efficiency gains in some embodiments. To provide self-autonomous read and write in accord with such implementations, the write address and read address may both be valid at the beginning of the cycle. Exemplary timing and circuitry diagrams illustrating such aspects are set forth in FIGS. 6 and 7 and described in more detail below. Here, since the write address is synchronized to the falling edge of clock, the write address may be registered first by the falling edge of the clock and then registered again by the next rising edge of the clock. It should be noted that circuit configurations and techniques wherein write self-timed pulse(s) are triggered by the completion of read pulse may also be utilized in connection with a read cycle followed by a write cycle in a separate IO SRAM chip, where chip output and write data may each have their own path and pin.

Turning to FIG. 4, an illustrative burst-two timing diagram of write address and write data is shown. According to such implementations, in order to trigger write after read in a self-timed fashion, the write address 228 and data 254, 258 may be available at the beginning of cycle 263, as shown in FIG. 4. As a function of being ready at the beginning of the cycle, self-autonomous read/write control in the burst-two mode may be achieved. Here, for example, implementations with such circuitry and/or configuration enable a read 242 to be triggered at any time, e.g., after or before receipt of the write pulse 240. Referring back to FIG. 2, the system 200 may be operated in a burst-two mode, wherein one read output and one write data are provided for both a clock rising edge and falling edge. In this mode, the read address of the current cycle may be established from the beginning of the cycle. Therefore the current cycle read operation may produce two output data to be delivered to output in the following cycle, one for the clock rising edge and one for the clock falling edge. The current cycle write address may be from the previous cycle. This operation may allow for synchronization of the write address with write data because there are two data to be collected in a cycle. One data may be from the clock rising edge and the other data may be from the clock falling edge. In high speed operation, there may not be enough time to do the writing in the current cycle, especially for the second data that is registered by the falling edge of clock. So, the write address and all the data may be collected and made ready to be written into array in the next cycle. Thus, the previous write address may be registered beforehand to be ready for the next cycle.

Since the input latch is at a transparent state before a next clock rising edge, the internal circuit may be considered to be asynchronous. So, all internal signals may be synchronized after the rising edge of the clock. High density memory arrays may be sub-divided into smaller arrays to improve speed and to reduce power. A smaller array may be called a section. In each section, there may be a word line decoder, column decoder, sense amplifier, data driver, and other circuits which may be used to perform the read and write operations of the memory cell. Therefore, a section may be a location where re-synchronizing of the word line decoding and column decoding may be performed.

FIG. 5 is a block diagram of another memory circuit according to aspects of the innovations herein. Referring to FIG. 5, an illustrative burst-two mode address self-timed latching of FIG. 2 is shown in more detail in which the decoded word line and column signals may be synchronized via the section enable signals. Elements for generating a self-timed input latch in this example may include input latches 512, pre-decoders 514, a self-timed pulse generator 546, a read and write control 548, transistors (such as NMOS transistors) or other switches 532, 536, 538, and/or registers 516, 518. A self-timed input latch generated by these elements may be used for any purpose. In this example, it may be used for memory operations involving row/section/column decoders 562, 564, 566 and memory array 570, although those of ordinary skill in the art will recognize that a self-timed input latch may be used with other memory configurations or circuits. Elements in FIG. 5 may, in certain implementations, function consonantly as comparable elements in FIG. 2, and hence, for such implementations, aspects of the waveforms in FIGS. 3 and 4 may be applicable to the block diagram of FIG. 5. Further, while the burst-two mode data path is omitted in FIG. 5, it is depicted in FIG. 2. The various control signals and the corresponding timing and waveforms in FIG. 5 may be consonant with those of the implementations shown in FIG. 2.

Illustrative schemes of re-synchronizing via utilization of section enable pulse and/or associated circuitry are shown in FIG. 5. The row and column addresses may be pre-decoded and may stand by waiting for a section enable pulse. The row and column addresses may not be controlled or constrained by signals/inputs such as a read pulse and/or clock. Further, the row and column decoded signal may be DC signals, which may provide low power consumption implementations. The default row and column address may be set for the read operation since read may always be the first operation at the beginning of a cycle. The row and column write address may be switched in by the write pulse when a read operation is completed. According to certain implementations herein, only the section signal may be combined with R/W pulse to create the section read enable pulse or section write enable pulse. With the section enable pulse, the section word line (SWL) and section column, as well as other control signals, may be synchronized locally. The combining of section signal and R/W pulse is shown in FIG. 5. At completion of either read and write pulse, all the Ain of section addresses may be pulled to logic low by the transistors 536 and 538, thus disabling all decoders in all the sections.

FIGS. 6-7 depict an exemplary burst-four mode timing diagram and illustrative circuitry involving self-autonomous read/write features, as discussed briefly above, according to aspects of the present innovations. Consistent with implementations herein, techniques of self-autonomous read/write control may be beneficial for high frequency operation. Write operations in SRAM may take less time to complete than read operations in many systems. When there is not enough time for a read operation in one cycle time, some cycle times in the following write cycle can be utilized for read operation of the previous cycle since write operation takes less time. In that case, the write operation may be delayed but may still be allowed to complete in the same write cycle. Accordingly, a higher frequency of read/write operations may be achieved. This technique may be applied to a read cycle followed by a write cycle or a read cycle followed by a no operation cycle. Such SRAM protocol(s) may be utilized in the burst four mode, where there are four outputs from one read address and four write data for one write address.

FIG. 6 is a timing diagram involving self-autonomous read/write aspects consistent with certain aspects related to the innovations herein. In the case of a read cycle followed by a write cycle, the self-timed transparent input latch design may also be applied. The read and write addresses may be synchronized to the rising edge of clock. So, the write address may be registered at a rising edge of a clock, whereas the read address may be controlled by the self-timed transparent latch. The read address latch can be at latched state or may be at the transparent state at the beginning of the write cycle, depending on the cycle time. For example, when the read cycle operation is encroaching into the next write cycle, the write pulse may not be generated and the read address may still be latched because the read self-timed pulse is still active. At the completion of a read self-timed pulse, the write self-timed pulse may be generated, and the read address latch may be changed to the transparent state. By the generated write pulse, the write address from the write register may be transmitted into the array (i.e., by WPb 640) to begin the write operation. When there is enough time for a read operation to complete in the read cycle, the read input latch may become transparent in the read cycle and the write self-timed pulsed may be generated in the write cycle with the valid write signal. FIG. 6 shows various aspects of a burst-four mode input protocol, while the input self-timed latching signal KAlat 604, read self-timed pulse 642 and write self-timed pulse 640 may, in some implementations, be consonant with the comparable waveforms 204, 242 and 240 in FIGS. 3 and 4.

FIG. 7 is a block diagram of yet another memory circuit consistent with FIG. 6 and certain aspects related to the innovations herein. Referring to FIG. 7, elements for generating a self-timed input latch may include input latches 712, pre-decoders 714, a self-timed pulse generator 746, a read and write control 748, transistors or other switches, and/or registers 716, 718, 719. A self-timed input latch generated by these elements may be used for any purpose. In this example, it may be used for memory operations within, e.g., a memory involving row/section/column decoders 762, 764, 766 and an array 770, although those of ordinary skill in the art will recognize that a self-timed input latch may be used with other memory configurations or circuits. In FIG. 7, illustrative read and write address inputs for the burst-four mode are shown. Here, various features may involve the write address and data-in paths. While a burst-four mode data path is not shown in FIG. 7, an illustrative configuration is shown and described in more detail in connection with FIG. 8. It should be noted that, in some implementations, it may take two cycles to collect all four data. Finally, various other elements in FIG. 7 may function similarly to those in FIGS. 2 and/or 5, including self-timed input latch features. Moreover, according to various innovative design aspects herein, the burst-four mode input path in FIG. 7 may be amenable to ready reconfiguration to function as burst-two mode, such as shown in FIG. 5, e.g., to facilitate fast and effective interoperation between modes.

FIG. 8 is a block diagram of an illustrative data path as may be associated with implementations of FIG. 7. In embodiments such as the one shown, a burst-four mode data path may employ a configuration of data registers which may handle four data signals for every write address in a manner suitable for processing with the circuitry and associated features set forth above. Additionally, further implementations may include at least one extra pipe or register in the burst-four write address path (in comparison to burst two mode) to match the data path so the write address and all four data will be available at the third rising clock edge.

FIG. 9 is an exemplary timing diagram of illustrative burst-four read, write address, and write data features. The timing diagram of FIG. 9 illustrates the availability of the write address WA1 and the four data D1-D4 as of the third rising edge 908 of the write clock Wclk in the section address logic. Clocking the registers (e.g. 802-822) with the write clock signal A and one or more other registers (e.g. 830) with the write clock signal B may enable all of the data and the write address to be available as of this third rising edge 908 of the write clock/cycle. Systems and methods involving circuitry configured to enable all the data and write addresses to be available may provide features of memory array design simplification and/or operational consistency. For example, such configurations may provide for memory array design involving straightforward/simplified operation and logic such that all four data can be written into an array at the same time. Further, such configurations may also provide features of consistent read operation, e.g., providing consistent read of all four data from the array at the same time in read cycle. As a function of such features, the data flow associated with the array may be the same for read and write.

Turning back to other aspects as associated with e.g. FIGS. 2, 5, and 7, embodiments described herein may involve row and column decoded signals that may be DC signals and/or operation features thereof. For example, all of the row, column, and section data may be read straight into the memory, e.g., without having any delay or control associated with read pulses. As such, this data is waiting at the memory for the section data to complete. Here, with regard to completion/use of section data, section data/signal(s) may be utilized for control and/or synchronization of memory operations and/or transfer of clock pulses into/inside the array, according to implementations herein. Among other things, additional reduction of power consumption may be achieved in that no control elements may need to be switched on and/or off to make the data available at the memory for read. Further, in some implementations, row and column functionality such as addressing may involve no clock, as the clock signal may only be involved in the section logic. This may provide power savings in some embodiments. Moreover, implementations herein may be configured such that chip addresses/addressing may be 'partially synchronized', e.g., meaning that only some but not all of the chip addressing need be synchronized, which may provide faster operation, power saving, and/or reduced complexity over other synchronized addressing regimes.

Accordingly, in high density memory arrays, signals may be inherently skew prone because of having to traverse large distances and multiple decoding. Signal skew may affect the random access time and cycle time in a pulse word line memory design. Consistent with the innovations herein, some or all the signal skews may be masked by taking advantage of setup time. By making use of setup time enabled by the transparency of input latch, all word line and column information may be transmitted to section ahead of a section enable pulse. Thus, the signal skews due to the location, distance difference, and variation in pre-decoding speed due to the random input patterns may be substantially eliminated in the section. This may also provide high density array design of a simplified nature.

Further, consistent with the self-timed transparent input latch features described herein, faster address access may provide reduction of random access time of the memory array, thus resulting in faster cycle time. With the self-timed pulse latch, a more useful setup and hold time window can also be obtained.

According to the innovations described herein, memory devices (e.g., semiconductor memory devices) may be provided. For example, a memory device may comprise self-timed pulse generator circuitry, first input latch circuitry coupled to the self-timed pulse generator circuitry, read/write control circuitry coupled to the self-timed pulse generator circuitry and first input latch circuitry, and/or second input latch circuitry coupled to the self-timed pulse generator circuitry. The self-timed pulse generator circuitry may receive a clock signal and generate a self-timed pulse having a first edge corresponding to a rising edge of the clock signal and a second edge. The first input latch circuitry may receive the self-timed pulse and a memory operation command and generate an internal memory operation command set to a latched state corresponding to the first edge of the self-timed pulse. The read/write control circuitry may receive the self-timed pulse and internal memory operation signal and perform a read operation and a write operation, the read operation being performed corresponding to one of the first edge or second edge of the self-timed pulse, and the write operation being performed corresponding to the one of the first edge or second edge of the self-timed pulse that does not correspond to the read operation. The second input latch circuitry may receive the self-timed pulse and a memory address and generate an internal address signal set to a latched state corresponding to the first edge of the self-timed pulse. Fast address access for read and write may be provided in the same cycle via a self-timed pulse in the input latch circuit and/or via associated control/scheme from the control circuit.

In another example, a semiconductor memory device may comprise a self-timed pulse generator, a first input latch circuit coupled to the self-timed pulse generator, a read and write control circuit coupled to the self-timed pulse generator and first input latch circuit, and/or a second input latch circuit coupled to the self-timed pulse generator. The self-timed pulse generator may receive a clock signal and generate a self-timed pulse having a first edge corresponding to a rising edge of the clock signal and a second edge. The first input latch circuit may receive the self-timed pulse and a memory operation command and generate an internal memory operation command set to a latched state corresponding to the first edge of the self-timed pulse. The read and write control circuit may receive the self-timed pulse and internal memory operation signal and perform a read operation and a write operation, the read operation being performed corresponding to one of the first edge and second edge of the self-timed pulse, and the write operation being performed corresponding to the one of the first edge and second edge of the self-timed pulse that does not correspond to the read operation. The second input latch circuit may receive the self-timed pulse and a memory address and generate an internal address signal set to a latched state corresponding to the first edge of the self-timed pulse. The self-timed pulse generator may generate a read self-timed pulse and a write self-timed pulse in the burst-two mode characterized in that a read self-timed pulse (RPb) is provided to the section address logic as a function of a KAlat signal, an input latch signal, and a read control signal, and during execution/effect of a valid write, a write self-timed pulse (WPb) is triggered by the completion of the read pulse.

In another example, a semiconductor memory device may comprise a self-timed pulse generator, a first input latch circuit coupled to the self-timed pulse generator, a read and write control circuit coupled to the self-timed pulse generator and first input latch circuit, and/or a second input latch circuit coupled to the self-timed pulse generator. The self-timed pulse generator may generate a self-timed pulse having a first edge corresponding to a rising edge of the clock signal and a second edge. The first input latch circuit may receive the self-timed pulse and a memory operation command and generate an internal memory operation command set to a latched state corresponding to the first edge of the self-timed pulse. The read and write control circuit may receive the self-timed pulse and internal memory operation signal and perform a read operation and a write operation, the read operation being performed corresponding to one of the first edge and second edge of the self-timed pulse, and the write operation being performed corresponding to the one of the first edge and second edge of the self-timed pulse that does not correspond to the read operation. The second input latch circuit may receive the self-timed pulse and a memory address and generate an internal address signal set to a latched state corresponding to the first edge of the self-timed pulse. The self-timed pulse generator may generate a read self-timed pulse and a write self-timed pulse in the burst-four mode characterized in that the read address latch can be at latched state or at the transparent state at the beginning of write cycle depending on the cycle time such that, when the read cycle operation is encroaching into the next write cycle, the write pulse will not be generated and the read address is still latched because the read self-timed pulse is still active, at the completion of read self-timed pulse, the write self-timed pulse will be generated and the read address latch is changed to transparent state, and wherein, via the generated write pulse, the write address from the write register is transmitted into the array to begin the write operation. In another example, a memory device may comprise a circuit. The circuit may be configured such that the circuit receives a clock signal and generates a self-timed pulse having a first edge corresponding to a rising edge of the clock signal and a second edge; receives a memory operation command and generates an internal memory operation command set to a latched state corresponding to the first edge of the self-timed pulse; performs a read operation and a write operation, the read operation being performed corresponding to one of the first edge or second edge of the self-timed pulse, and the write operation being performed corresponding to the one of the first edge or second edge of the self-timed pulse that does not correspond to the read operation; and receives a memory address and generates an internal address signal set to a latched state corresponding to the first edge of the self-timed pulse. Fast address access for read and write may be provided in the same cycle via a self-timed pulse and/or via associated control/scheme.

In embodiments based on any of the aforementioned examples, or in other embodiments, additional features may be provided. A read operation may comprise generating a read self-timed pulse. A write operation may comprise generating a write self-timed pulse. The first input latch circuit may enter an unlatched state at a time corresponding to the second edge of the self-timed pulse, and/or the second input latch circuit may enter an unlatched state at a time corresponding to the second edge of the self-timed pulse. Control to transmit row and column data into memory may be provided via the section address logic. All of the data and write addresses may be available as of a third rising edge or a next rising edge of the write clock. The registers and/or circuitry may be arranged to provide a simplified configuration that aids memory array design. The configuration may include straightforward logic and/or operation such that all four data can be written into the memory at the same time. The registers and circuitry may provide consistent read operation. Consistent read of all four data from the memory may be provided at the same time in read cycle. As a function of the arrangement/configuration, data flow associated with (into and out of) the memory may be the same for read and write. Section data may be utilized to control memory operations associated with the row and column addresses into/out of the memory. Section data may be utilized to synchronize memory operations associated with the row and column addresses into/out of the memory. Section data may be utilized to transfer clock pulses into/inside the memory. Chip addresses/addressing may be 'partially synchronized', such that only some but not all of the chip addressing is synchronized, thereby yielding faster operation, power saving and/or reduced complexity over existing synchronized addressing regimes. The read address may be synchronized to the rising edge of clock and/or the write address may be synchronized to the failing edge of clock. A read operation and a write operation may be performed in the same cycle. There may be a small time gap between the read pulse (RPb) and the write pulse (WPb), which may prevent any overlapping of read and write address. The KAlat self-timed pulse width may be determined to ensure the completion of read operations. Emulation of array timing and/or feedbacks from the memory may be used to determine the self-timed pulse width. At the end of the KAlat pulse, all input latches may be changed from a latched state to a transparent state to allow for acceptance of the next cycle input information. When there is enough time for read operation to complete in the read cycle, the read input latch may become transparent in the read cycle and the write self-timed pulsed may be generated in the write cycle with the valid write signal.

Memory devices may further comprise a plurality of second input latch circuits coupled to the self-timed pulse generator circuitry and receiving the self-timed pulse and a memory address, each of the plurality of second input latch circuits generating an internal address signal set to a latched state corresponding to the first edge of the self-timed pulse. Memory devices may further comprise one or more pre-decoders. Memory devices may further comprise one or more registers positioned in a path of the internal address signal, the one or more registers providing synchronization and/or coherence in association with a write operation data path. Memory devices may further comprise one or more registers positioned in a data path, the one or more registers providing memory array design simplification and/or operational consistency. Memory devices may further comprise a plurality of registers positioned in the data path including a first set of one or more registers clocked with a first write signal and a second group of one or more registers clocked with a second write signal, wherein all of the data and write addresses are available as of a third or next rising edge of the write clock.

According to the innovations described herein, methods for operating memory devices (e.g., semiconductor memory devices) may be provided. For example, a semiconductor memory device operation method may comprise receiving, with a self-timed pulse generator, a clock signal; generating, with the self-timed pulse generator, a self-timed pulse having a first edge corresponding to a rising edge of the clock signal and a second edge; receiving, with a first input latch circuit, the self-timed pulse and a memory operation command; generating, with the first input latch circuit, an internal memory operation command set to a latched state corresponding to the first edge of the self-timed pulse; receiving, with a read and write control circuit, the self-timed pulse and internal memory operation signal; performing, with the read and write control circuit, a read operation and a write operation, the read operation being performed corresponding to one of the first edge and second edge of the self-timed pulse, and the write operation being performed corresponding to the one of the first edge and second edge of the self-timed pulse that does not correspond to the read operation; receiving, with a second input latch circuit, the self-timed pulse and a memory address; and generating, with the second input latch circuit, an internal address signal set to a latched state corresponding to the first edge of the self-timed pulse. Fast address access for read and write may be provided in the same cycle via a self-timed pulse in the input latch circuit and/or via associated control/scheme from the control circuit.

In another example, a method of operating a semiconductor memory device may comprise receiving, with a self-timed pulse generator, a clock signal; generating, with the self-timed pulse generator, a self-timed pulse having a first edge corresponding to arising edge of the clock signal and a second edge; receiving, with a first input latch circuit, the self-timed pulse and a memory operation command; generating, with the first input latch circuit, an internal memory operation command set to a latched state corresponding to the first edge of the self-timed pulse; receiving, with a read and write control circuit, the self-timed pulse and internal memory operation signal; performing, with the read and write control circuit, a read operation and a write operation, the read operation being performed corresponding to one of the first edge and second edge of the self-timed pulse, and the write operation being performed corresponding to the one of the first edge and second edge of the self-timed pulse that does not correspond to the read operation; receiving, with a second input latch circuit, the self-timed pulse and a memory address; and generating, with the second input latch circuit, an internal address signal set to a latched state corresponding to the first edge of the self-timed pulse. The self-timed pulse generator may be configured to generate a read self-timed pulse and a write self-timed pulse in the burst-two mode characterized in that a read self-timed pulse (RPb) is provided to the section address logic as a function of a KAlat signal, an input latch signal, and a read control signal, and during execution/effect of a valid write, a write self-timed pulse (WPb) is triggered by the completion of the read pulse.

In another example, a method of operating a semiconductor memory device may comprise/receiving, with a self-timed pulse generator, a clock signal; generating, with the self-timed pulse generator, a self-timed pulse having a first edge corresponding to a rising edge of the clock signal and a second edge; receiving, with a first input latch circuit, the self-timed pulse and a memory operation command; generating, with the first input latch circuit, an internal memory operation command set to a latched state corresponding to the first edge of the self-timed pulse; receiving, with a read and write control circuit, the self-timed pulse and internal memory operation signal; performing, with the read and write control circuit, a read operation and a write operation, the read operation being performed corresponding to one of the first edge and second edge of the self-timed pulse, and the write operation being performed corresponding to the one of the first edge and second edge of the self-timed pulse that does not correspond to the read operation; receiving, with a second input latch circuit, the self-timed pulse and a memory address; and generating, with the second input latch circuit, an internal address signal set to a latched state corresponding to the first edge of the self-timed pulse. The self-timed pulse generator may be configured to generate a read self-timed pulse and a write self-timed pulse in the burst-four mode characterized in that the read address latch can be at latched state or is at the transparent state at the beginning of write cycle depending on the cycle time such that, when the read cycle operation is encroaching into the next write cycle, the write pulse will not be generated and the read address is still latched because the read self-timed pulse is still active, at the completion of read self-timed pulse, the write self-timed pulse will be generated and the read address latch is changed to transparent state, and wherein, via the generated write pulse, the write address from the write register is transmitted into the array to begin the write operation.

In embodiments based on any of the aforementioned examples, or in other embodiments, additional features and/or processes may be provided. Performing the read operation may comprise generating a read self-timed pulse. Performing the write operation may comprise generating a write self-timed pulse. Methods may comprise entering, with the first input latch circuit, an unlatched state at a time corresponding to the second edge of the self-timed pulse; and entering, with the second input latch circuit, an unlatched state at a time corresponding to the second edge of the self-timed pulse. Methods may comprise providing, via the section address logic, control to transmit row and column data into. Methods may comprise receiving, with a plurality of second input latch circuits, the self-timed pulse and a memory address; and generating, with the plurality of second input latch circuits, an internal address signal set to a latched state corresponding to the first edge of the self-timed pulse. Methods may comprise providing, via the section address logic, control to transmit row and column data into memory. All of the data and write addresses may be available as of a third and/or next rising edge of the write clock. Methods may comprise utilizing section data to control memory operations associated with the row and column addresses into/out of the memory. Methods may comprise utilizing section data to synchronize memory operations associated with the row and column addresses into/out of the memory. Methods may comprise utilizing section data to transfer clock pulses into/inside the memory. Methods may comprise synchronizing the read address to the rising edge of clock; and synchronizing the write address to the falling edge of clock. Methods may comprise performing a read operation and a write operation in the same cycle. There may be a small time gap between the read pulse (RPb) and the write pulse (WPb), which may prevent any overlapping of read and write address. Methods may comprise determining the KAlat self-timed pulse width to ensure the completion of read operations. Methods may comprise using emulation of array timing and/or feedbacks from the memory to determine the self-timed pulse width. Methods may comprise, at the end of the KAlat pulse, changing all input latches from a latched state to a transparent state to allow for acceptance of the next cycle input information. Methods may comprise providing consistent read of two data from the memory at the same time in read cycle. Methods may comprise partially synchronizing chip addresses/addressing, such that only some but not all of the chip addressing is synchronized, thereby yielding faster operation, power saving and/or reduced complexity over existing synchronized addressing regimes. When there is enough time for read operation to complete in the read cycle, the read input latch may become transparent in the read cycle and the write self-timed pulsed may be generated in the write cycle with the valid write signal. Methods may comprise providing consistent read of all four data from the memory at the same time in read cycle.

In addition to the above SRAMs and SRAM architecture, the present inventions also include, inter alia, methods of fabricating SRAM devices consistent with the features and/or functionality herein, products (such as SRAMs or products embodying SRAMs), and products produced via such processes. By way of example and not limitation, methods of such fabrication may include known SRAM manufacturing processes in CMOS technologies involving aspects such as p-mos and n-mos transistor formation, multiple metallization layers and/or local interconnects, among others. A variety of exemplary/staple processes here, for example, being set forth in the backgrounds/disclosures of U.S. Pat. Nos. 4,794,561, 5,624,863, 5,994,178, 6,001,674, 6,117,754, 6,127,706, 6,417,549, 6,894,356, and 7,910,427 as well as U.S. patent application publication No. US2007/0287239A1, which are incorporated herein by reference. For example, a method of fabricating a memory device may comprise forming transistors onto one or more substrates; forming interconnects, including multiple metallization layers and/or interconnects between the transistors; and connecting the transistors and/or other components wherein a memory device consistent with one or more aspects of this disclosure is provided.

As disclosed herein, features consistent with the present inventions may be utilized via and/or involved with computer hardware, software and/or firmware. For example, the systems and methods disclosed herein may be embodied in or used in connection with various forms including, for example, memory, data processors, such as in computing devices that also includes memory, a database, digital electronic circuitry, firmware, software, or in combinations of them. Further, while some of the disclosed implementations describe specific hardware components, systems and methods consistent with the innovations herein may be implemented in the context of any combination of hardware, software and/or firmware. Moreover, the above-noted features and other aspects and principles of the innovations herein may be implemented in various memory environments. Such environments and related applications may be specially constructed for performing the various routines, processes and/or operations according to the invention or they may include a general-purpose computer or computing platform selectively activated or reconfigured by code to provide the necessary functionality. The processes disclosed herein are not inherently related to any particular computer, network, architecture, environment, or other apparatus, and may be implemented by a suitable combination of hardware, software, and/or firmware. For example, various general-purpose machines may be used with programs written in accordance with teachings of the invention, or it may be more convenient to construct a specialized apparatus or system to perform the required methods and techniques.

Aspects of the method and system described herein, such as the logic, may be implemented as functionality programmed into any of a variety of circuitry, including programmable logic devices ("PLDs"), such as field programmable gate arrays ("FPGAs"), programmable array logic ("PAL") devices, electrically programmable logic and memory devices and standard cell-based devices, as well as application specific integrated circuits. Some other possibilities for implementing aspects include: memory devices, microcontrollers with memory (such as EEPROM), embedded microprocessors, firmware, software, etc. Furthermore, aspects may be embodied in microprocessors having software-based circuit emulation, discrete logic (sequential and combinatorial), custom devices, fuzzy (neural) logic, quantum devices, and hybrids of any of the above device types. The underlying device technologies may be provided in a variety of component types, e.g., metal-oxide semiconductor field-effect transistor ("MOSFET") technologies like complementary metal-oxide semiconductor ("CMOS"), bipolar technologies like emitter-coupled logic ("ECL"), polymer technologies (e.g., silicon-conjugated polymer and metal-conjugated polymer-metal structures), mixed analog and digital, and so on.

It should also be noted that the various logic and/or functions disclosed herein may be enabled using any number of combinations of hardware, firmware, and/or as data/instructions embodied in various machine-readable or computer-readable media, in terms of their behavioral, register transfer, logic component, and/or other characteristics. Computer-readable media in which such formatted data and/or instructions may be embodied include, but are not limited to, non-volatile storage media in various forms (e.g., optical, magnetic or semiconductor storage media), though does not include transitory media such as carrier waves.

Unless the context clearly requires otherwise, throughout the description and the claims, the words "comprise," "comprising," and the like are to be construed in an inclusive sense as opposed to an exclusive or exhaustive sense; that is to say, in a sense of "including, but not limited to." Words using the singular or plural number also include the plural or singular number respectively. Additionally, the words "herein," "hereunder," "above," "below," and words of similar import refer to this application as a whole and not to any particular portions of this application. When the word "or" is used in reference to a list of two or more items, that word covers all of the following interpretations of the word: any of the items in the list, all of the items in the list and any combination of the items in the list.

Although certain presently preferred implementations of the invention have been specifically described herein, it will be apparent to those skilled in the art to which the inventions pertain that variations and modifications of the various implementations shown and described herein may be made without departing from the spirit and scope of the innovations herein. Accordingly, it is intended that the inventions be limited only to the extent required by the applicable rules of law.

The invention claimed is:

1. A memory device comprising:
    self-timed pulse generator circuitry that receives a clock signal and generates a self-timed pulse having a first edge corresponding to a rising edge of the clock signal and a second edge;
    first input latch circuitry coupled to the self-timed pulse generator circuitry and receiving the self-timed pulse and a memory operation command, the first input latch circuitry generating an internal memory operation command set to a latched state corresponding to the first edge of the self-timed pulse;
    read/write control circuitry coupled to the self-timed pulse generator circuitry and first input latch circuitry receiving the self-timed pulse and internal memory operation signal, the read/write control circuitry performing a read operation and a write operation, the read operation being performed corresponding to one of the first edge or second edge of the self-timed pulse, and the write operation being performed corresponding to the one of the first edge or second edge of the self-timed pulse that does not correspond to the read operation; and
    second input latch circuitry coupled to the self-timed pulse generator circuitry and receiving the self-timed pulse and a memory address, the second input latch circuitry generating an internal address signal set to a latched state corresponding to the first edge of the self-timed pulse;
    wherein fast address access for read and write is provided in the same cycle via a self-timed pulse in the input latch circuit and/or via associated control/scheme from the control circuit.

2. The device of claim 1 wherein the read operation comprises generating a read self-timed pulse.

3. The device of claim 1 wherein the write operation comprises generating a write self-timed pulse.

4. The device of claim 1 wherein:
    the first input latch circuit enters an unlatched state at a time corresponding to the second edge of the self-timed pulse; and
    the second input latch circuit enters an unlatched state at a time corresponding to the second edge of the self-timed pulse.

5. The device of claim 1 wherein control to transmit row and column data into memory is provided via the section address logic.

6. The device of claim 5 further comprising:
    a plurality of second input latch circuits coupled to the self-timed pulse generator circuitry and receiving the self-timed pulse and a memory address, each of the plurality of second input latch circuits generating an internal address signal set to a latched state corresponding to the first edge of the self-timed pulse.

7. The device of claim 5 wherein control to transmit row and column data into memory is provided via the section address logic.

8. The device of claim 1 further comprising one or more pre-decoders.

9. The device of claim 1 further comprising one or more registers positioned in a path of the internal address signal, the one or more registers providing synchronization and/or coherence in association with a write operation data path.

10. The device of claim 1 further comprising one or more registers positioned in a data path, the one or more registers providing memory array design simplification and/or operational consistency.

11. The device of claim 1, wherein all of the data and write addresses are available as of a third rising edge of the write clock.

12. The device of claim 1, further comprising a plurality of registers positioned in the data path including a first set of one or more registers clocked with a first write signal and a second group of one or more registers clocked with a second write signal, wherein all of the data and write addresses are available as of a third rising edge of the write clock.

13. The device of claim 1, wherein all of the data and write addresses are available as of a next rising edge of the write clock.

14. The device of claim 1, further comprising a plurality of registers positioned in the data path including a first set of one or more registers clocked with a first write signal and a second group of one or more registers clocked with a second write signal, wherein all of the data and write addresses are available as of a next rising edge of the write clock.

15. A semiconductor memory device comprising:
a self-timed pulse generator that receives a clock signal and generates a self-timed pulse having a first edge corresponding to a rising edge of the clock signal and a second edge;
a first input latch circuit coupled to the self-timed pulse generator and receiving the self-timed pulse and a memory operation command, the first input latch circuit generating an internal memory operation command set to a latched state corresponding to the first edge of the self-timed pulse;
a read and write control circuit coupled to the self-timed pulse generator and first input latch circuit and receiving the self-timed pulse and internal memory operation signal, the read and write control circuit performing a read operation and a write operation, the read operation being performed corresponding to one of the first edge and second edge of the self-timed pulse, and the write operation being performed corresponding to the one of the first edge and second edge of the self-timed pulse that does not correspond to the read operation; and
a second input latch circuit coupled to the self-timed pulse generator and receiving the self-timed pulse and a memory address, the second input latch circuit generating an internal address signal set to a latched state corresponding to the first edge of the self-time pulse;
wherein the self-timed pulse generator generates a read self-timed pulse and a write self-timed pulse in a burst-two mode characterized in that:
a read self-timed pulse (RPb) is provided to the section address logic as a function of a KAlat signal, an input latch signal, and a read control signal; and
during execution/effect of a valid write, a write self-timed pulse (WPb) is triggered by the completion of the read pulse.

16. The device of claim 15 wherein the read address is synchronized to the rising edge of clock and the write address is synchronized to the falling edge of clock.

17. The device of claim 15 wherein a read operation and a write operation are perforn1ed in the same cycle.

18. The device of claim 15 wherein there is a small time gap between the read pulse (RPb) and the wTite pulse (WPb), which may prevent any overlapping of read and write address.

19. The device of claim 15 wherein the KAlat self-timed pulse width is determined to ensure the completion of read operations.

20. The device of claim 15 wherein emulation of array timing and/or feedbacks from the memory are used to determine the self-timed pulse width.

21. The device of claim 15 wherein, at the end of the KAlat pulse, all input latches are changed from a latched state to a transparent state to allow for acceptance of the next cycle input information.

22. The device of claim 15 further comprising one or more registers positioned in a data path and providing memory array design simplification and/or operational consistency.

23. The device of claim 15 wherein all of the data and write addresses are available as of a next rising edge of the write clock.

24. The device of claim 15 further comprising a plurality of registers positioned in the data path including a first set of one or more registers clocked with a first write signal and a second group of one or more registers clocked with a second write signal, wherein all of the data and write addresses are available as of a next rising edge of the write clock.

25. A semiconductor memory device comprising:
a self-timed pulse generator that receives a clock signal and generates a self-timed pulse having a first edge corresponding to a rising edge of the clock signal and a second edge;
a first input latch circuit coupled to the self-timed pulse generator and receiving the self-timed pulse and a memory operation command, the first input latch circuit generating an internal memory operation command set to a latched state corresponding to the first edge of the self-timed pulse;
a read and write control circuit coupled to the self-timed pulse generator and the first input latch circuit and receiving the self-timed pulse and internal memory operation signal, the read and write control circuit performing a read operation and a write operation, the read operation being performed corresponding to one of the first edge and second edge of the self-timed pulse, and the write operation being performed corresponding to the one of the first edge and second edge of the self-timed pulse that does not correspond to the read operation; and
a second input latch circuit coupled to the self-timed pulse generator and receiving the self-timed pulse and a memory address, the second input latch circuit generating an internal address signal set to a latched state corresponding to the first edge of the self-timed pulse;
wherein the self-timed pulse generator generates a read self-timed pulse and a write self-timed pulse in a burst-four mode characterized in that:
the read address latch can be at latched state or at the transparent state at the beginning of w1ite cycle depending on the cycle time such that, when the read cycle operation is encroaching into the next write cycle, the write pulse will not be generated and the read address is still latched because the read self-timed pulse is still active;
at the completion of read self-timed pulse, the write self-timed pulse will be generated and the read address latch is changed to transparent state;

wherein, via the generated write pulse, the write address from the write register is transmitted into the array to begin the write operation.

26. The device of claim 25 wherein, when there is enough time for read operation to complete in the read cycle, the read input latch becomes transparent in the read cycle and the write self-timed pulsed is generated in the write cycle with the valid write signal.

27. The device of claim 25 further comprising one or more registers positioned in the data path to provide memory array design simplification and/or operational consistency.

28. The device of claim 25, wherein all of the data and write addresses are available as of a third rising edge of the write clock.

29. The device of claim 25 further comprising a plurality of registers positioned in the data path including a first set of one or more registers clocked with a first write signal and a second group of one or more registers clocked with a second write signal, wherein all of the data and write addresses are available as of a third rising edge of the write clock.

30. A semiconductor memory device operation method comprising:
receiving, with a self-timed pulse generator, a dock signal;
generating, with the self-timed pulse generator, a self-timed pulse having a first edge corresponding to a rising edge of the dock signal and a second edge;
receiving, with a first input latch circuit, the self-timed pulse and a memory operation command;
generating, with the first input latch circuit, an internal memory operation command set to a latched state corresponding to the first edge of the self-timed pulse;
receiving, with a read and write control circuit, the self-timed pulse and internal memory operation signal;
performing with the read and write control circuit, a read operation and a write operation, the read operation being performed corresponding to one of the first edge and second edge of the self-timed pulse, and the write operation being performed corresponding to the one of the first edge and second edge of the self-timed pulse that does not correspond to the read operation;
receiving, with a second input latch circuit, the self-timed pulse and a memory address; and
generating, with the second input latch circuit, an internal address signal set to a latched state corresponding to the first edge of the self-timed pulse;
wherein fast address access for read and write is provided in the same cycle via a self-timed pulse in the input latch circuit and/or via associated control/scheme from the control circuit.

31. The method of claim 30 wherein performing the read operation comprises generating a read self-timed pulse.

32. The method of claim 30 wherein performing the write operation comprises generating a write self-timed pulse.

33. The method of claim 30 further comprising:
entering, with the first input latch circuit, an unlatched state at a time corresponding to the second edge of the self-timed pulse; and
entering, with the second input latch circuit, an unlatched state at a time corresponding to the second edge of the self-timed pulse.

34. The method of claim 30 further comprising providing, via the section address logic, control to transmit row and column data into.

35. The method of claim 34 further comprising:
receiving, with a plurality of second input latch circuits, the self-timed pulse and a memory address; and
generating, with the plurality of second input latch circuits, an internal address signal set to a latched state corresponding to the first edge of the self-timed pulse.

36. The method of claim 34 further comprising providing, via the section address logic, control to transmit row and column data into memory.

37. The method of claim 30 where all of the data and write addresses are available as of a third rising edge of the write clock.

38. The method of claim 30 wherein all of the data and write addresses are available as of a next rising edge of the write clock.

39. A method of operating a semiconductor memory device comprising:
receiving, with a self-timed pulse generator, a clock signal;
generating, with the self-timed pulse generator, a self-timed pulse having a first edge corresponding to a rising edge of the clock signal and a second edge;
receiving, with a first input latch circuit, the self-timed pulse and a memory operation command;
generating, with the first input latch circuit, an internal memory operation command set to a latched state corresponding to the first edge of the self-time pulse;
receiving, with a read and write control circuit, the self-timed pulse and internal memory operation signal;
performing, with the read and write control circuit, a read operation and a write operation, the read operation being performed corresponding to one of the first edge and second edge of the self-timed pulse, and the write operation being performed corresponding to the one of the first edge and second edge of the self-timed pulse that does not correspond to the read operation;
receiving, with a second input latch circuit, the self-timed pulse and a memory address; and
generating, with the second input latch circuit, an internal address signal set to a latched state corresponding to the first edge of the self-timed pulse;
wherein the self-timed pulse generator is configured to generate a read self-timed pulse and a write self-timed pulse in a burst-two mode characterized in that:
a read self-timed pulse (RPb) is provided to the section address logic as a function of a KAlat signal, an input latch signal, and a read control signal; and
during execution/effect of a valid write, a write self-timed pulse (WPb) is triggered by the completion of the read pulse.

40. The method of claim 39 further comprising:
synchronizing the read address to the rising edge of clock; and
synchronizing the write address to the falling edge of clock.

41. The method of claim 39 further comprising performing a read operation and a write operation in the same cycle.

42. The method of claim 39 further comprising determining the KAlat self-timed pulse width to ensure the completion of read operations.

43. The method of claim 39 further comprising using emulation of array timing and/or feedbacks from the memory to determine the self-timed pulse width.

44. The method of claim 39 further comprising, at the end of the KAlat pulse, changing all input latches from a latched state to a transparent state to allow for acceptance of the next cycle input information.

45. The method of claim 39 further comprising providing all of the data and write addresses to be available as of a next rising edge of the write clock.

46. The method of claim 39 further comprising providing consistent read of two data from the memory at the same time in read cycle.

47. A method of operating a semiconductor memory device comprising:
   receiving, with a self-timed pulse generator, a clock signal;
   generating, with the self-timed pulse generator, a self-timed pulse having a first edge corresponding to a rising edge of the clock signal and a second edge:
   receiving, with a first input latch circuit, the self-timed pulse and a memory operation command;
   generating, with the first input latch circuit, an internal memory operation command set to a latched state corresponding to the first edge of the self-timed pulse;
   receiving, with a read and write control circuit, the self-timed pulse and internal memory operation signal;
   performing, with the read and write control circuit, a read operation and a write operation, the read operation being performed corresponding to one of the first edge and second edge of the self-timed pulse, and the write operation being performed corresponding to the one of the first edge and second edge of the self-timed pulse that does not correspond to the read operation;
   receiving, with a second input latch circuit, the self-timed pulse and a memory address; and
   generating, with the second input latch circuit, an internal address signal set to a latched state corresponding to the first edge of the self-timed pulse;
   wherein the self-timed pulse generator is configured to generate a read self-timed pulse and a write self-timed pulse in a burst-four mode characterized in that:
   the read address latch can be at latched state or is at the transparent state at the beginning of write cycle depending on the cycle time such that, when the read cycle operation is encroaching into the next write cycle, the write pulse will not be generated and the read address is still latched because the read self-timed pulse is still active;
   at the completion of read self-timed pulse, the write self-timed pulse will be generated and the read address latch is changed to transparent state;
   wherein, via the generated write pulse, the write address from the write register is transmitted into the array to begin the write operation.

48. The method of claim 47 wherein, when there is enough time for read operation to complete in the read cycle, the read input latch becomes transparent in the read cycle and the write self-timed pulsed is generated in the write cycle with the valid write signal.

49. The method of claim 47 further comprising providing all of the data and write addresses to be available as of a third rising edge of the write clock.

50. The method of claim 47 further comprising providing consistent read of ail from data from the memory at the same time in read cycle.

* * * * *